US012615943B2

(12) United States Patent
Lazo Martinez et al.

(10) Patent No.: US 12,615,943 B2
(45) Date of Patent: Apr. 28, 2026

(54) DISPLAY DEVICE AND METHOD OF MANUFACTURING THE SAME

(71) Applicant: Samsung Display Co., Ltd., Yongin-si (KR)

(72) Inventors: Israel Esteban Lazo Martinez, Yongin-si (KR); Beom-Soo Shin, Yongin-si (KR); Suk Hoon Kang, Yongin-si (KR); Suji Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 427 days.

(21) Appl. No.: 18/367,780

(22) Filed: Sep. 13, 2023

(65) Prior Publication Data

US 2024/0206274 A1    Jun. 20, 2024

(30) Foreign Application Priority Data

Dec. 19, 2022    (KR) ........................ 10-2022-0178263

(51) Int. Cl.
H10K 59/38    (2023.01)
H10K 59/12    (2023.01)
H10K 59/80    (2023.01)

(52) U.S. Cl.
CPC ......... H10K 59/38 (2023.02); H10K 59/1201 (2023.02); H10K 59/8791 (2023.02)

(58) Field of Classification Search
CPC .............. H10K 59/38; H10K 59/1201; H10K 59/8791; H10K 59/122; H10K 59/12; H10K 59/875; H10K 59/877–878; H10K 59/88; H10K 50/854; H10K 50/856; H10K 71/00
See application file for complete search history.

(56) References Cited

U.S. PATENT DOCUMENTS

2020/0111842 A1* 4/2020 Kim ..................... H10K 59/173

FOREIGN PATENT DOCUMENTS

KR    20210153191 A    12/2021

OTHER PUBLICATIONS

C. R. Crick et al., Advanced Analysis of Nanoparticle Composites—a Means Toward Increasing the Efficiency of Functional Materials, RSC Adv., 5, 53789-53795 (2015), Department of Chemistry, Imperial College London, South Kensington Campus, London.
Carmine D'Agostino, et al., Swelling-Induced Structural Changes and Microparticle Uptake of Gelatin Gels Probed by NMR and CLSM, Mar. 21, 2017, The Royal Society of Chemistry, United Kingdom.

(Continued)

*Primary Examiner* — Anne M Hines
*Assistant Examiner* — Jose M Diaz
(74) *Attorney, Agent, or Firm* — CANTOR COLBURN LLP

(57) ABSTRACT

A display device includes a base substrate and a partition wall structure disposed on the base substrate, the partition wall structure including light control particles, and having an accommodation opening, and a color conversion layer disposed within the accommodation opening, and including color conversion particles, where a density of the light control particles located at an outer portion of the partition wall structure is greater than a density of the light control particles located at a center portion of the partition wall structure.

20 Claims, 10 Drawing Sheets

(56)  References Cited

OTHER PUBLICATIONS

Shuaifei Zhao, Osmotic Pressure versus Swelling Pressure: Comment on"Bifunctional Polymer Hydrogel Layers as Forward Osmosis DrawAgents for Continuous Production of Fresh Water Using SolarEnergy", Mar. 19, 2014, American Chemical Society, United States of America.

* cited by examiner

DISPLAY DEVICE AND METHOD OF MANUFACTURING THE SAME

This application claims priority to Korean Patent Application No. 10-2022-0178263, filed on Dec. 19, 2022, and all the benefits accruing therefrom under 35 U.S.C. § 119, the content of which in its entirety is herein incorporated by reference.

BACKGROUND

1. Field

The disclosure relates to a display device and method of manufacturing the display device.

2. Description of the Related Art

A display device is a device which displays an image and may include a light emitting device which emits light and a color conversion layer which converts a wavelength of light emitted from the light emitting device. Also, the display device may include a partition wall structure partitioning the color conversion layer. Light emitted from the light emitting device passes through the color conversion layer and is recognized by a user.

Display quality of the display device may be affected by a path of light incident on the partition wall structure.

SUMMARY

Embodiments provide a display device with improved reliability and improved display quality.

Embodiments provide a manufacturing method of the display device with improved manufacturing process accuracy and efficiency.

A display device according to an embodiment includes a base substrate, a partition wall structure disposed on the base substrate, including light control particles, and having an accommodation opening, and a color conversion layer disposed within the accommodation opening, and including color conversion particles, and where a density of the light control particles at an outer portion of the partition wall structure is greater than a density of the light control particles at a center portion of the partition wall structure.

In an embodiment, the light control particles may scatter or reflect light incident thereon.

In an embodiment, the light control particles may have an average size in a range of about 50 nm to about 300 nm.

In an embodiment, an amount of the light control particles included in the partition wall structure may be about 7 wt % or more based on a total weight of the partition wall structure.

A method of manufacturing a display device according to an embodiment includes forming a preliminary partition wall layer on a base substrate to cover the base substrate, disposing a mask having an opening on the preliminary partition wall layer, exposing the preliminary partition wall layer exposed by the opening, developing the preliminary partition wall layer with a developer containing light control particles to remain a first portion of the preliminary partition wall layer which is exposed and to remove a second portion other than the first portion, curing the first portion which remains to form a partition wall structure having an accommodation opening, and forming a color conversion layer including color conversion particles in the accommodation opening.

In an embodiment, in the developing the preliminary partition wall layer to remove the second portion, the first portion may swell by absorbing the developer, and the light control particles may be drawn into the first portion which is swollen.

In an embodiment, in the forming the partition wall structure, the light control particles drawn into the first portion may be encapsulated within the first portion.

In an embodiment, the light control particles may be included in the partition wall structure after the forming the partition wall structure.

In an embodiment, a density of the light control particles at an outer portion of the partition wall structure may be greater than a density of the light control particles at a center portion of the partition wall structure after the forming the partition wall structure.

In an embodiment, an amount of the light control particles included in the developer may be about 10 wt % or more based on a total weight of the developer.

In an embodiment, the method may further include removing the light control particles in the accommodation opening using a rinsing liquid after the forming the partition wall structure and before the forming the color conversion layer.

In an embodiment, in the forming the preliminary partition wall layer, the preliminary partition wall layer may further cover a dummy substrate located adjacent to the base substrate and having a first alignment mark disposed thereon.

In an embodiment, the mask may include a second alignment mark, and in the disposing the mask, the mask may be disposed based on a position of the first alignment mark and a position of the second alignment mark.

In an embodiment, the light control particles may scatter or reflect light incident thereon.

In an embodiment, the light control particles may have an average size in a range of about 50 nm to about 300 nm.

A method of manufacturing a display device according to another embodiment may include forming a preliminary partition wall layer on a base substrate to cover the base substrate, disposing a mask having an opening on the preliminary partition wall layer, exposing the preliminary partition wall layer exposed by the opening, developing the preliminary partition wall layer with a developer to leave a first portion of the preliminary partition wall layer which is exposed and to remove a second portion other than the first portion, providing a carrier fluid containing light control particles to the first portion which remains, curing the first portion which remains to form a partition wall structure having an accommodation opening, and forming a color conversion layer including color conversion particles in the accommodation opening.

In an embodiment, in the developing the preliminary partition wall layer to remove the second portion, the first portion may swell by absorbing the developer, and in the providing the carrier fluid, the light control particles may be drawn into the first portion which is swollen.

In an embodiment, in the forming the partition wall structure, the light control particles drawn into the first portion may be encapsulated within the first portion.

In an embodiment, the light control particles may be included in the partition wall structure after the forming the partition wall structure.

In an embodiment, a density of the light control particles at an outer portion of the partition wall structure may be greater than a density of the light control particles at a center portion of the partition wall structure after the forming the partition wall structure.

In the display device according to embodiments, the display device may include the partition wall structure and the color conversion layer. The color conversion layer may be disposed within the accommodation openings defined by the partition wall structure and may convert a color of incident light. The partition wall structure may include the light control particles which control a path of incident light. For example, the light control particles may scatter or reflect light incident on the partition wall structure. In addition, a density of the light control particles at the outer portion of the partition wall structure may be greater than a density of the light control particles at the center portion of the partition wall structure. Accordingly, a path of light incident to the partition wall structure among lights emitted from the light emitting device can be easily adjusted. Accordingly, light efficiency of the display device may be increased and/or display quality of the display device may be improved.

In addition, according to the manufacturing method of the display device according to embodiments, the preliminary partition wall layer may be exposed and developed to form the partition wall structure, and even if the preliminary partition wall layer does not include the light control particles, the partition wall structure including the light control particles may be formed.

Accordingly, in the process of aligning the mask, since the preliminary partition wall layer does not include the light control particles, interference of a signal path for recognizing the first alignment mark can be reduced or prevented. Accordingly, a degree of recognition of the first alignment mark may be improved. Accordingly, accuracy and efficiency of the manufacturing process of the display device may be improved.

In addition, since the preliminary partition wall layer does not include the light control particles in the exposure process using the mask, interference of a path of light traveling into the preliminary partition wall layer may be reduced or prevented. For example, light traveling into the preliminary partition wall layer may not be reflected or scattered. Accordingly, non-uniformity of an exposed portion of the preliminary partition wall layer may be reduced or prevented. Accordingly, it may be possible to prevent an undercut from occurring in the partition wall structure formed by a subsequent process. In addition, generation of residual film due to reflected or scattered light can be reduced or prevented. Accordingly, reliability of the partition wall structure may be improved and display quality of the display device may be improved.

BRIEF DESCRIPTION OF THE DRAWINGS

The above and other features of embodiments of the disclosure will become apparent by describing in detail embodiments thereof with reference to the accompanying drawings.

DETAILED DESCRIPTION

Figures 1, 2:
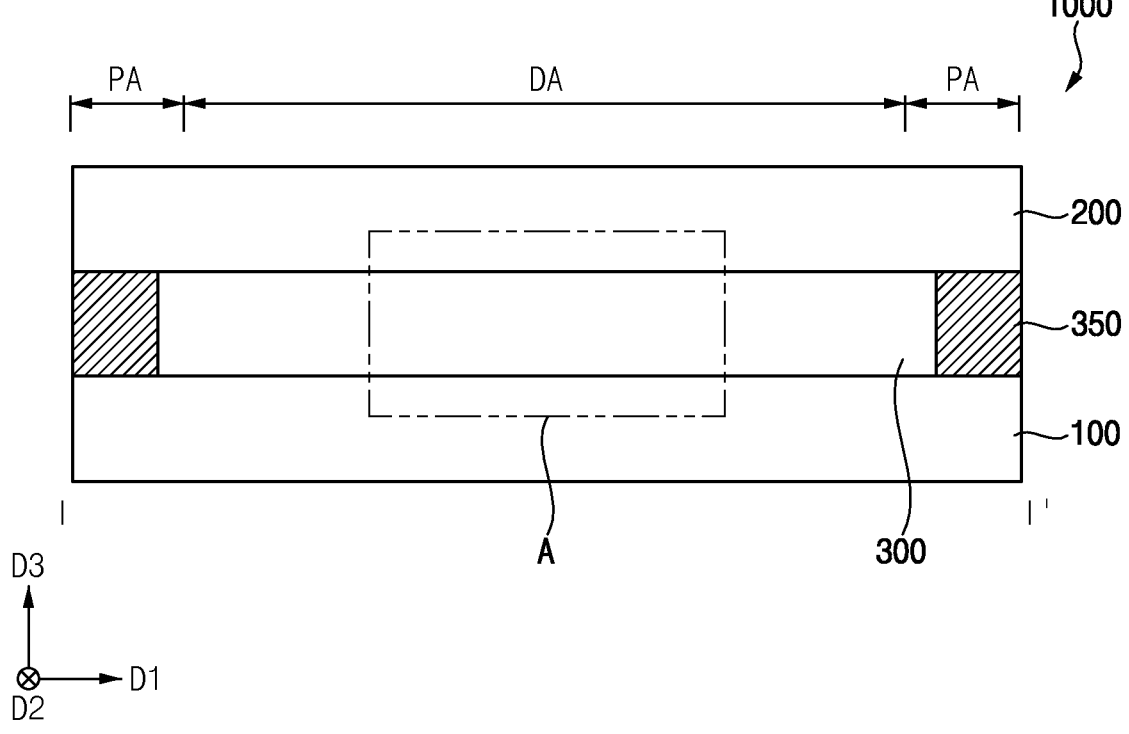
FIG. 1 is a perspective view illustrating a display device according to an embodiment.
FIG. 2 is a cross-sectional view taken along line I-I' of FIG. 1 according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art, where like reference numerals refer to like elements throughout.

According to an embodiment, FIG. 1 is a perspective view illustrating a display device, and FIG. 2 is a cross-sectional view taken along line I-I' of FIG. 1.

Referring to FIGS. 1 and 2, the display device 1000 may include a lower structure 100, an upper structure 200, a filling layer 300 and a sealing member 350.

In an embodiment, the display device 1000 may be divided into a display area DA and a peripheral area PA. The display area DA may display an image, and the peripheral area PA may be located around the display area DA. For example, the peripheral area PA may surround the display area DA.

In an embodiment, the display device 1000 may have a rectangular shape in a plan view. However, the invention is not necessarily limited thereto, and the display device 1000 may have various shapes. In such an embodiment, a plane may be defined from a first direction D1 and a second direction D2 intersecting the first direction D1. A third direction D3 may be perpendicular to the plane.

In an embodiment, the upper structure 200 may be disposed on the lower structure 100 where the upper structure 200 may face the lower structure 100. The upper structure 200 may include a color filter which transmits light having a specific color.

A detailed description of the lower structure 100 and the upper structure 200 will be described later.

In an embodiment, the filling layer 300 may be disposed between the lower structure 100 and the upper structure 200. The filling layer 300 may act as a buffer against external pressure applied to the display device 1000. For example, the filling layer 300 may maintain a gap between the lower structure 100 and the upper structure 200. The filling layer 300 may include a material capable of transmitting light. For example, the filling layer 300 may include an organic material. Examples of materials that can be used as the filling layer 300 may include silicone-based resins and epoxy-based resins. These materials may be used alone or in combination with each other. In other embodiments, the filling layer 300 may be omitted.

In an embodiment, the sealing member 350 may be disposed between the lower structure 100 and the upper structure 200 in the peripheral area PA. The sealing member 350 may be disposed along edges of the lower structure 100 and the upper structure 200 in the peripheral area PA to surround the display area DA in a plan view. In addition, the lower structure 100 and the upper structure 200 may be bonded through the sealing member 350. The sealing member 350 may include an organic material. For example, the sealing member 350 may include an epoxy resin and/or the like.

Figure 3:
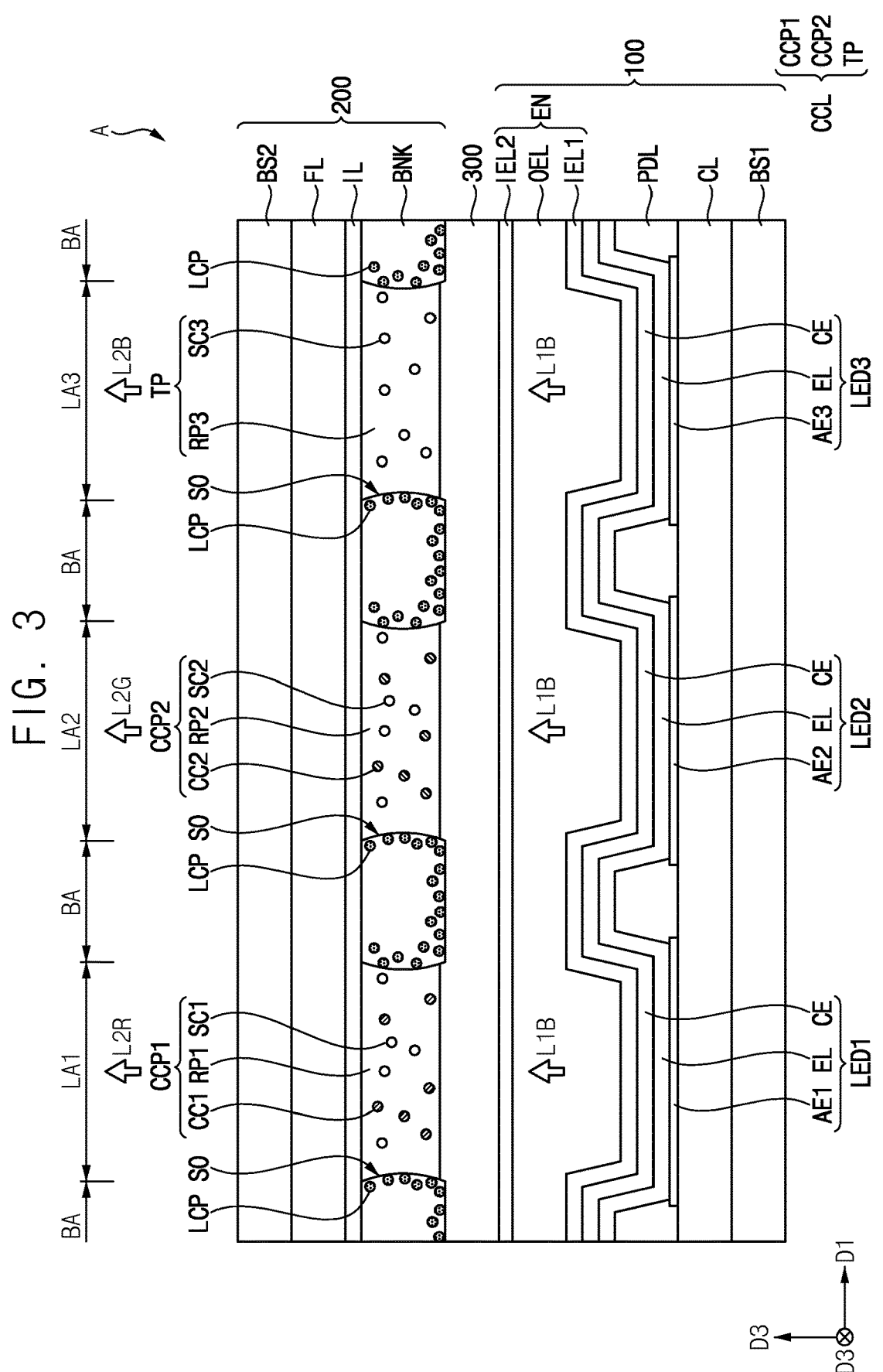
FIG. 3 is an enlarged cross-sectional view of an area 'A' of FIG. 2 according to an embodiment.

FIG. 3 is an enlarged cross-sectional view of an area 'A' of FIG. 2 according to an embodiment.

Referring to FIGS. 1 to 3, in an embodiment, the display area DA may include a light emitting area and a light blocking area BA. Light LIB generated in the lower structure 100 and incident to the upper structure 200 (hereinafter referred to as incident light L1B) may be emitted to outside through the light emitting area. For example, incident light L1B may have a blue color. The light emitting area may include first to third light emitting areas LA1, LA2, and LA3, respectively, for emitting light of different colors. For example, the first light emitting area LA1 may emit first transmitted light L2R having a red color, and the second light emitting area LA2 may emit second transmitted light L2G having a green color, and the third light emitting area LA3 may emit third transmitted light L2B having a blue color.

In an embodiment, the first to third light emitting areas LA1, LA2, and LA3, respectively, may be spaced apart from each other and may be arranged to repeat each other. The light blocking area BA may surround the first to third light emitting areas LA1, LA2, and LA3, respectively. For example, the light blocking area BA may have a grid shape.

In an embodiment, the lower structure 100 may include a first base substrate BS1, a circuit layer CL, a pixel defining layer PDL, first to third light emitting devices LED1, LED2, LED3, respectively, and an encapsulation layer EN.

The first base substrate BS1 may be an insulating substrate formed of a transparent or opaque material. In an embodiment, the first base substrate BS1 may include glass. In this case, the lower structure 100 may be a rigid structure. In another embodiment, the first base substrate BS1 may include plastic. In such an embodiment, the lower structure 100 may be a flexible structure.

In an embodiment, the circuit layer CL may be disposed on the first base substrate BS1. The circuit layer CL may include an insulating layer, a semiconductor pattern, a conductive pattern, and/or a signal line. For example, an insulating layer, a semiconductor layer, and/or a conductive layer may be formed on the first base substrate BS1 by a method such as coating and/or deposition, and then, through a plurality of exposure processes, the insulating layer, the semiconductor layer, and/or the conductive layer may optionally be patterned. Accordingly, the semiconductor pattern, the conductive pattern, and/or the signal line included in the circuit layer CL may be formed.

In an embodiment, first to third pixel electrodes AE1, AE2, and/or AE3, respectively, may be disposed on the circuit layer CL. Each of the first to third pixel electrodes AE1, AE2, and/or AE3, respectively, may include a conductive material such as metal, alloy, conductive metal nitride, conductive metal oxide, and/or transparent conductive material. Each of the first to third pixel electrodes AE1, AE2, and/or AE3, respectively, may have a single-layer structure or a multi-layer structure including a plurality of conductive layers.

In an embodiment, the pixel defining layer PDL may be disposed on the first to third pixel electrodes AE1, AE2, and/or AE3, respectively. The pixel defining layer PDL may include an organic insulating material. Examples of the organic insulating material may include photoresist, poly-acryl-based resin, polyimide-based resin, polyamide-based resin, and/or siloxane-based resin, acrylic-based resin, epoxy-based resin, and the like. These may be used alone and/or in combination with each other. The pixel defining layer PDL may define a pixel opening exposing at least a portion of each of the first to third pixel electrodes AE1, AE2, and/or AE3, respectively.

According to an embodiment, an emission layer EL may be disposed on the first to third pixel electrodes AE1, AE2, and/or AE3, respectively, exposed by the pixel opening of the pixel defining layer PDL. In an embodiment, the emission layer EL may continuously extend over a plurality of pixels and/or on the display area DA. In another embodiment, the emission layer EL may be separated from the emission layer of an adjacent pixel.

According to an embodiment, the emission layer EL may include an organic light emitting material and quantum dots. In an embodiment, the emission layer EL may generate blue light. However, the invention is not necessarily limited thereto. In another embodiment, the emission layer EL may generate red light and/or green light, and/or may generate lights having different colors according to pixels.

In an embodiment, functional layers such as a hole injection layer, a hole transport layer, an electron transport layer, and/or an electron injection layer may be disposed above and/or below the emission layer EL.

In an embodiment, a common electrode CE may be disposed on the emission layer EL. The common electrode CE may include a conductive material such as a metal, an alloy, a conductive metal nitride, a conductive metal oxide, and/or a transparent conductive material. The common electrode CE may have a single-layer structure and/or a multi-layer structure including a plurality of conductive layers. In an embodiment, the common electrode CE may continuously extend over a plurality of pixels and/or on the display area DA.

In an embodiment, the first pixel electrode AE1, the emission layer EL, and the common electrode CE may form the first light emitting device LED1, the second pixel electrode AE2, the emission layer EL, and the common electrode CE may form the second light emitting device LED2, and the third pixel electrode AE3, the emission layer EL, and the common electrode CE may form the third light emitting device LED3.

In an embodiment, the encapsulation layer EN may be disposed on the common electrode CE. The encapsulation layer EN may include at least one inorganic encapsulation layer and/or at least one organic encapsulation layer. In an embodiment, the encapsulation layer EN may include a first inorganic encapsulation layer IEL1 disposed on the common electrode CE, an organic encapsulation layer OEL disposed on the first inorganic encapsulation layer IEL1, and a second inorganic encapsulation layer IEL2 disposed on the organic encapsulation layer OEL.

In an embodiment, the upper structure 200 may be disposed in the third direction D3 from the encapsulation layer EN. The upper structure 200 may include a second base substrate BS2, a functional layer FL, an inorganic insulating layer IL, a partition wall structure BNK, and a color conversion layer CCL. The color conversion layer CCL may include a first color conversion part CCP1, a second color conversion part CCP2, and a transmission part TP.

In an embodiment, the second base substrate BS2 may be an insulating substrate formed of a transparent or opaque material. The second base substrate BS2 may include glass. In this case, the upper structure 200 may be a rigid structure. In another embodiment, the second base substrate BS2 may include plastic. In this case, the upper structure 200 may be a flexible structure.

In an embodiment, the functional layer FL may be disposed under the second base substrate BS2. The functional layer FL may include a plurality of layers to improve display performance of the display device 1000 and/or improve user convenience of the display device 1000. For example, the functional layer FL may include a color filter layer which passes only light of a specific wavelength. As another example, the functional layer FL may include a plurality of refraction layers to improve light emission efficiency of the display device 1000. In still yet another example, the functional layer FL may include a touch sensing layer which senses a user's touch.

In an embodiment, the inorganic insulating layer IL may be disposed under the functional layer FL. The inorganic insulating layer IL may protect the functional layer FL. The inorganic insulating layer IL may include silicon nitride, silicon oxide, silicon oxynitride, and/or the like.

In an embodiment, the partition wall structure BNK may be disposed under the inorganic insulating layer IL. A plurality of accommodation openings SO may be defined in the partition wall structure BNK. For example, as shown in FIG. 3, the accommodation openings SO of the partition wall structure BNK may overlap the first to third light emitting areas LA1, LA2, and LA3, respectively. The accommodation openings SO may be spaces capable of accommodating an ink composition in a process of forming the first color conversion part CCP1, the second color conversion part CCP2, and the transmission part TP. The partition wall structure BNK may overlap the light blocking area BA and may have a grid shape.

In an embodiment, the partition wall structure BNK may include an inorganic material and/or an organic material. Examples of the organic material that can be used as the partition wall structure BNK may include photoresist, poly-acrylic resin, polyimide resin, polyamide resin, siloxane resin, acrylic resin, epoxy resin, and/or the like. These may be used alone or in combination with each other.

In an embodiment, the partition wall structure BNK may further include a light blocking material. Examples of the light blocking material that can be used as the partition wall structure BNK may include black pigment, dye, and carbon black. These may be used alone or in combination with each other.

In an embodiment, the partition wall structure BNK may include light control particles LCP. For example, the light control particles LCP may be dispersed within the partition wall structure BNK. In an embodiment, a density of the light control particles LCP at an outer portion of the partition wall structure BNK may be greater than a density of the light control particles LCP at a center of the partition wall structure BNK. That is, the light control particles LCP may be more intensively dispersed at the outer portion of the partition wall structure BNK than at the center portion. The light control particles LCP may scatter and/or reflect light incident thereon.

Accordingly, in an embodiment, a path of light incident to the partition wall structure BNK among lights emitted from the light emitting devices LED1, LED2, and LED3, respectively, may be controlled by the light control particles LCP. Accordingly, light efficiency of the display device 1000 may be increased and/or the display quality of the display device 1000 may be improved.

In an embodiment, the light control particles LCP may have an average size in a range of about 50 nm to about 300 nm, specifically about 50 nm to about 250 nm. When the average size of each of the light control particles LCP satisfies the above range, the light control particles LCP may be more easily dispersed in the partition wall structure BNK.

In an embodiment, a content of the light control particles LCP included in the partition wall structure BNK may be about 7 wt % (percentage by weight) or more based on a total weight of the partition wall structure BNK. Specifically, the content of the light control particles LCP included in the partition wall structure BNK may be in a range of about 7 wt % to about 20 wt %, preferably about 7 wt % to about 15 wt %, based on the total weight of the partition wall structure BNK. When the content of the light control particles LCP satisfies the above range, the path of light incident to the partition wall structure BNK may be more easily controlled. Also, deterioration in durability of the partition wall structure BNK may be prevented or reduced.

In an embodiment, the light control particles LCP may include at least one selected from an inorganic material, a metal material, an organic light emitting material, and a quantum dot. Examples of the inorganic material that can be used as the light control particles LCP may include titanium oxide (TiO2), aluminum oxide (Al2O3), zirconium oxide (ZrO2), and silicon oxide (SiO2). Examples of the metal material that can be used as the light control particles LCP may include gold (Au), silver (Ag), aluminum (Al), and/or the like. All of the above materials may be used alone or in combination with each other.

In an embodiment, the first color conversion part CCP1, the second color conversion part CCP2, and the transmission part TP may be disposed under the inorganic insulating layer IL, and may overlap the first to third light emitting areas LA1, LA2, and LA3, respectively. For example, the first color conversion part CCP1, the second color conversion part CCP2, and the transmission part TP may be respectively disposed in the accommodation openings SO of the partition wall structure BNK. The first color conversion part CCP1, the second color conversion part CCP2, and the transmission part TP may form the color conversion layer CCL.

In an embodiment, the first color conversion part CCP1 may overlap the first light emitting area LA1. The first color conversion part CCP1 may convert the incident light L1B having a blue color into the first transmitted light L2R having a red color. For example, the first color conversion part CCP1 may include a resin part RP1, scatters SC1, and color conversion particles CC1.

In an embodiment, the scatters SC1 may increase an optical path by scattering the incident light L1B without substantially changing a wavelength of the incident light L1B incident on the first color conversion part CCP1. The scatters SC1 may include a metal oxide and/or an organic material. Optionally, in another embodiment, the scatters SC1 may be omitted.

In an embodiment, the color conversion particles CC1 may include a quantum dot. The quantum dot may be defined as a semiconductor material having nanocrystals and may have a specific band gap depending on its composition and size. Accordingly, the quantum dot may absorb incident light and emit light having a different wavelength from the wavelength of the incident light. For example, the quantum dot may have a diameter of about 100 nm or less, and may have a diameter of about 1 nm to about 20 nm. For example, the color conversion particles CC1 of the first color conversion part CCP1 may include a quantum dot which absorbs blue light and emits red light.

In an embodiment, the scatters SC1 and the color conversion particles CC1 may be disposed in the resin part RP1. For example, the resin part RP1 may include an epoxy-based resin, an acrylic-based resin, a phenol-based resin, a melamine-based resin, a cardo-based resin, an imide-based resin, and/or the like.

In an embodiment, the second color conversion part CCP2 may overlap the second emission area LA2. The second color conversion part CCP2 may convert the incident light L1B having a blue color into the second transmitted light L2G having a green color. For example, the second color conversion part CCP2 may include a resin part RP2, scatters SC2, and color conversion particles CC2. The resin part RP2 and the scatters SC2 of the second color conversion part CCP2 may be substantially the same as or similar to the resin part RP1 and the scatters SC1 of the first color conversion part CCP1.

In an embodiment, the color conversion particles CC2 of the second color conversion part CCP2 may include a quantum dot. For example, the color conversion particles CC2 of the second color conversion part CCP2 may include a quantum dot which absorbs blue light and emits green light.

In an embodiment, the transmission part TP may overlap the third light emitting area LA3. For example, the transmission part TP may include a resin part RP3 and scatters SC3. The resin part RP3 and the scatters SC3 of the transmission part TP may be substantially the same as or similar to the resin part RP1 and the scatters SC1 of the first color conversion part CCP1.

In an embodiment, the transmission part TP may not convert the incident light L1B having a blue color. That is, the transmission part TP may emit the third transmitted light L2B having a wavelength substantially the same as a wavelength of the incident light L1B.

In an embodiment, as the first to third transmitted lights L2R, L2G, and L2B, respectively, emitted to the outside through the second base substrate BS2 are combined, the image may be displayed in the display area DA.

According to embodiments, the display device 1000 may include the partition wall structure BNK and the color conversion layer CCL. The color conversion layer CCL may be disposed within the accommodation openings SO defined by the partition wall structure BNK and may convert a color of incident light. The partition wall structure BNK may include the light control particles LCP which control a path of incident light. For example, the light control particles LCP may scatter and/or reflect light incident on the partition wall structure BNK. In addition, a density of the light control particles LCP at the outer portion of the partition wall structure BNK may be greater than a density of the light control particles LCP at the center portion of the partition wall structure BNK. Accordingly, a path of light incident to the partition wall structure BNK among lights emitted from the light emitting device can be easily adjusted. Accordingly, light efficiency of the display device 1000 may be increased and/or the display quality of the display device 1000 may be improved.

FIGS. 4 to 11 are cross-sectional views illustrating a method of manufacturing an upper structure included in the display device of FIG. 3 according to an embodiment.

Hereinafter, a method of manufacturing the upper structure 200 included in the display device 1000 according to an embodiment will be described with reference to FIGS. 4 to 11.

Figure 4:
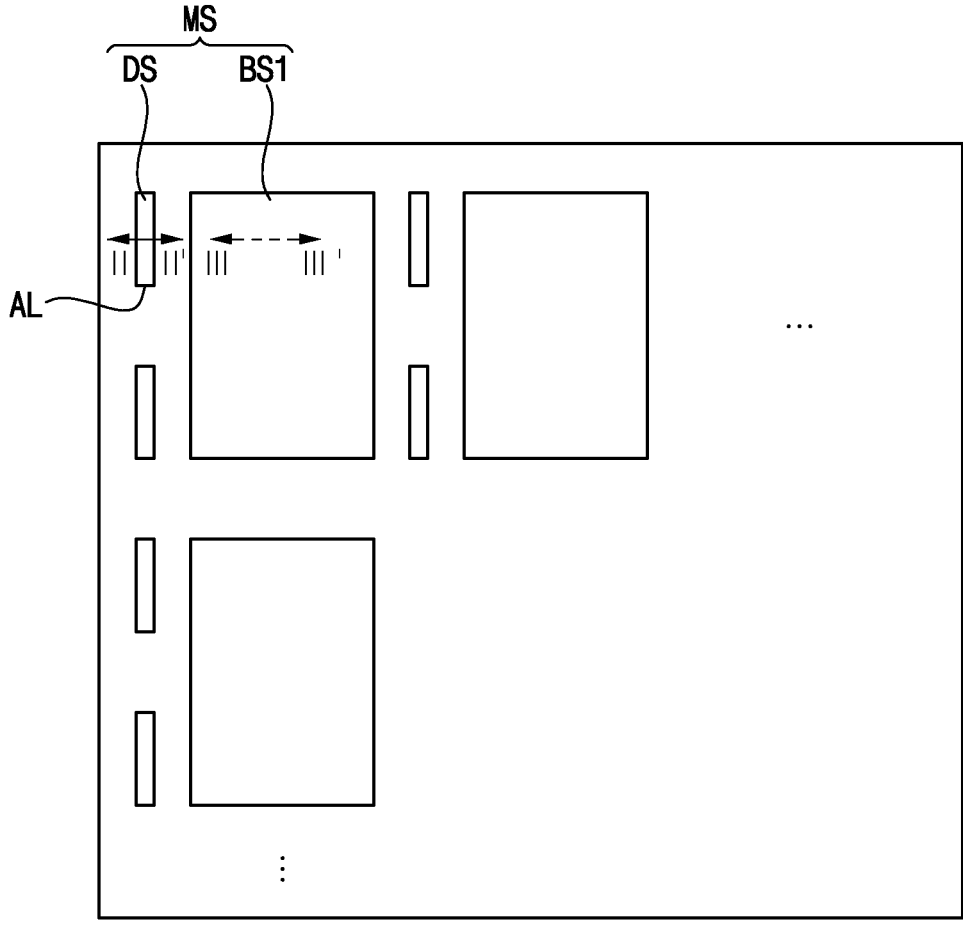
FIG. 4 is a cross-sectional view of an upper structure illustrating a method of manufacturing an upper structure included in the display device of FIG. 3 according to an embodiment.
Figure 5:
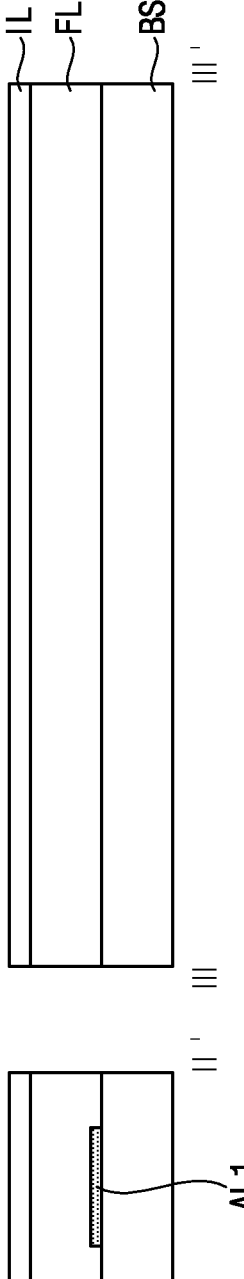
FIG. 5 is a cross-sectional view of an upper structure illustrating a method of manufacturing an upper structure included in the display device of FIG. 3 according to an embodiment.

Referring to FIGS. 4 and 5, according to an embodiment, in order to improve a manufacturing yield of the display device 1000, the plurality of lower structures 100 may be simultaneously formed on a mother substrate MS having a relatively large area. In this case, a portion of the mother substrate MS on which the lower structures 100 are not formed may be referred to as a dummy substrate DS. That is, the mother substrate MS may include the dummy substrate DS and the second base substrate BS2. In an embodiment, the dummy substrate DS may be not included in the display device 1000 as a final product, and may be separated and removed after a manufacturing process of the lower structure 100 described later or during the manufacturing process of the lower structure 100.

As shown in FIG. 5, in an embodiment, the functional layer FL and the inorganic insulating layer IL may be formed on the dummy substrate DS and the second base substrate BS2. In another embodiment, the functional layer FL on the dummy substrate DS may be omitted. In this case, the inorganic insulating layer IL may be directly disposed on the dummy substrate DS. In yet another embodiment, the inorganic insulating layer IL on the dummy substrate DS may be omitted.

In an embodiment, the first alignment mark AL1 may be disposed on the dummy substrate DS. The first alignment mark AL1 may have any configuration that can be recognized in an exposure step to be described later. Although FIG. 5 illustrates that the first alignment mark AL1 is directly disposed on the dummy substrate DS, the invention is not necessarily limited thereto. For example, in another embodiment, the first alignment mark AL1 may be disposed on the functional layer FL or the inorganic insulating layer IL.

Figure 6:
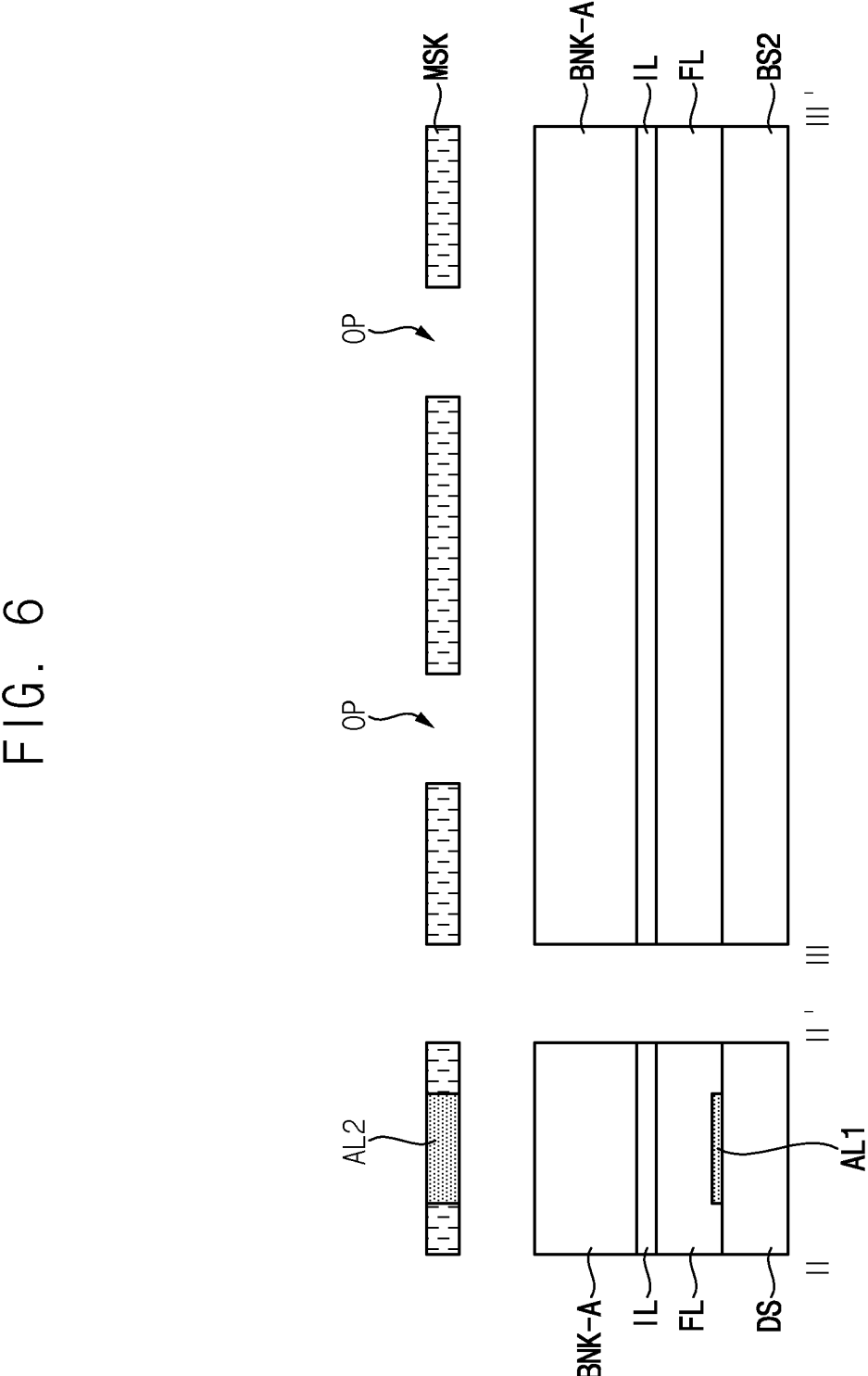
FIG. 6 is a cross-sectional view of an upper structure illustrating a method of manufacturing an upper structure included in the display device of FIG. 3 according to an embodiment.

In an embodiment and referring to FIG. 6, a preliminary partition wall layer BNK-A may be formed on the second base substrate BS2 (specifically, the inorganic insulating layer IL). For example, the preliminary partition wall layer BNK-A may be formed to cover the second base substrate BS2 (specifically, the inorganic insulating layer IL). The preliminary partition wall layer BNK-A may be formed to cover the dummy substrate DS as well. That is, the preliminary partition wall layer BNK-A may be formed to cover the inorganic insulating layer IL on the dummy substrate DS as well.

In one embodiment, the preliminary partition wall layer BNK-A may be formed of an inorganic material and/or an organic material. Examples of the organic material that can be used as the preliminary partition wall layer BNK-A may include photoresist, polyacrylic resin, polyimide resin, polyamide resin, siloxane resin, acrylic resin, epoxy resin, and/or the like. These materials may be used alone or in combination with each other.

In an embodiment, the preliminary partition wall layer BNK-A may further include a light blocking material. Examples of the light blocking material that can be used as the preliminary partition wall layer BNK-A may include black pigment, dye, carbon black, and/or the like. These materials may be used alone or in combination with each other.

In an embodiment, the preliminary partition wall layer BNK-A may include a photosensitive material. For example, the preliminary partition wall layer BNK-A may include a material having relatively high light transmittance.

After the preliminary partition wall layer BNK-A is formed, a mask MSK may be disposed on the preliminary partition wall layer BNK-A. The mask MSK may have an opening OP. In an embodiment, the mask MSK may include a second alignment mark AL2. It may be possible to check whether the mask MSK is misaligned from the second alignment mark AL2. For example, the mask MSK may be disposed on the preliminary partition wall layer BNK-A such that the second alignment mark AL2 overlaps the first alignment mark AL1. That is, it is possible to check whether the mask MSK is misaligned by checking whether the first alignment mark AL1 and the second alignment mark AL2 correspond to each other.

In an embodiment, the second alignment mark AL2 may be an aperture pattern and/or a semi-transmissive pattern, and the first alignment mark AL1 may be a reflective pattern corresponding to the aperture pattern and/or the semi-transmissive pattern. Accordingly, it may be possible to check whether a signal passing through the second alignment mark AL2 is reflected by the first alignment mark AL1 and recognized. When the signal reflected by the first alignment mark AL1 is recognized, an exposure UV1 process to be described later may be performed, and when the signal reflected by the first alignment mark AL1 is not recognized, the mask MSK can be rearranged.

Figure 7:
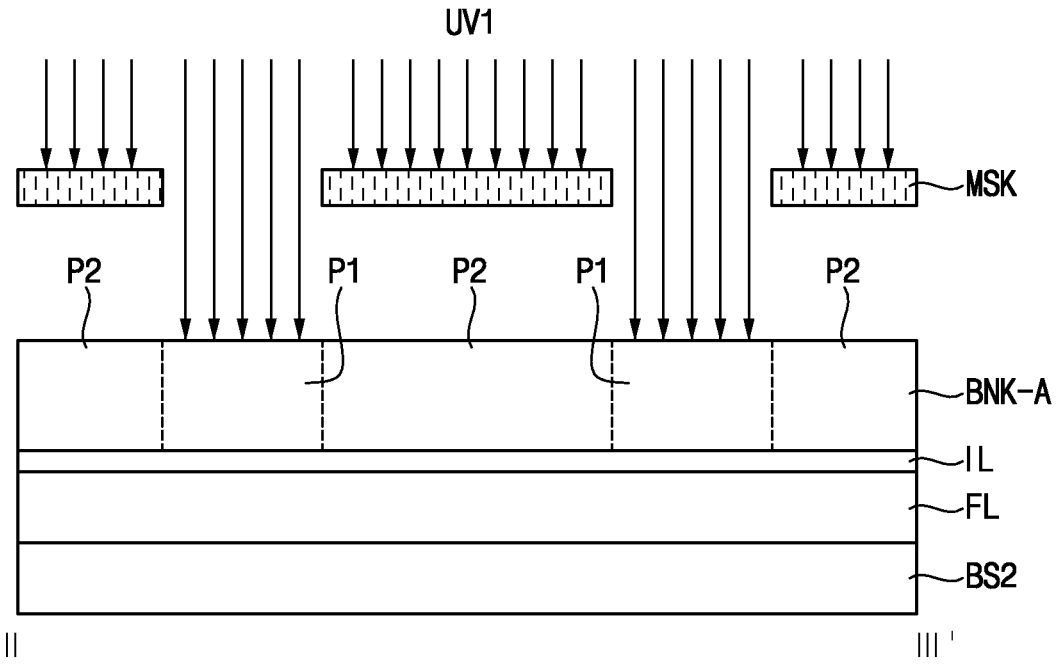
FIG. 7 is a cross-sectional view of an upper structure illustrating a method of manufacturing an upper structure included in the display device of FIG. 3 according to an embodiment.

Referring to FIG. 7, in an embodiment, the preliminary partition wall layer BNK-A exposed through the opening OP of the mask MSK may be exposed to UV1. That is, a first portion P1 of the preliminary partition wall layer BNK-A exposed through the opening OP may be exposed to UV1, and the second portion P2 may not be exposed.

Figure 8:
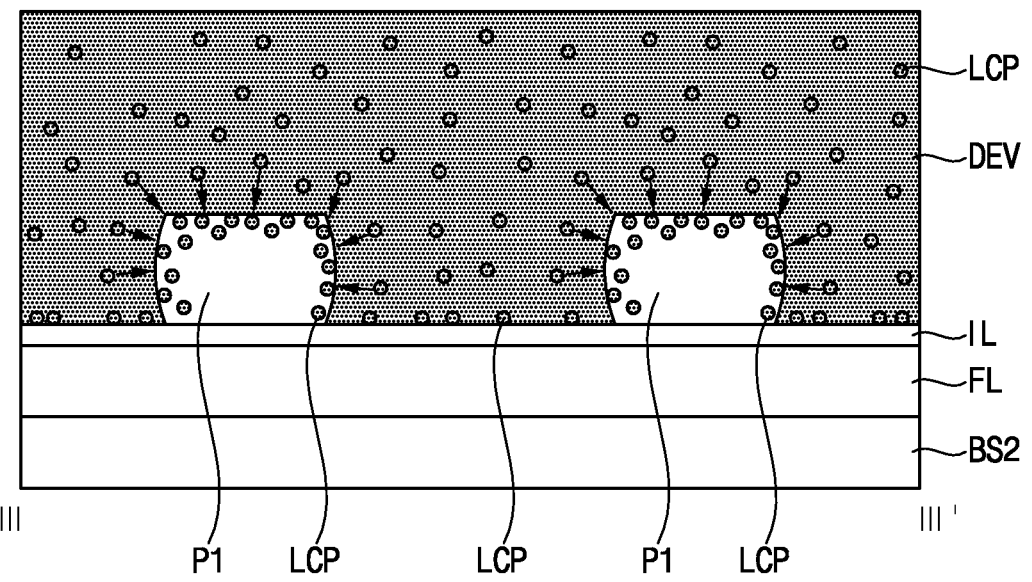
FIG. 8 is a cross-sectional view of an upper structure illustrating a method of manufacturing an upper structure included in the display device of FIG. 3 according to an embodiment.

Referring further to FIG. 8, in an embodiment, the preliminary partition wall layer BNK-A may be developed with the developer DEV to leave the first portion P1 which is exposed in place and to remove the second portion P2.

In an embodiment, in a process of developing the preliminary partition wall layer BNK-A with the developer DEV, the first portion P1 which remains may absorb the developer DEV and swell. Accordingly, spaces (e.g., pores) through which external materials may be drawn may be formed on an outer portion (e.g., surface) of the first portion P1.

In an embodiment, the developer DEV may include the light control particles LCP. For example, the light control particles LCP may be dispersed in the developer DEV.

Examples of materials that can be used as the developer DEV may include aqueous potassium hydroxide, aqueous sodium hydroxide, aqueous sodium carbonate, and/or the like. However, the invention is not necessarily limited thereto.

Accordingly, in an embodiment, in a process of developing the preliminary partition layer BNK-A, the light control particles LCP included in the developer DEV may be drawn into the first portion P1. For example, the light control particles LCP may be drawn into the first portion P1 through the spaces that are formed as the first portion P1 swells.

In an embodiment, the light control particles LCP may be concentrated in the outer portion of the first portion P1. In other words, a density of the light control particles LCP at the outer portion of the first portion P1 may be greater than a density of the light control particles LCP at the center portion of the first portion P1.

In an embodiment, the light control particles LCP may have an average size in a range of about 50 nm to about 300 nm, specifically about 50 nm to about 250 nm. When the average size of each of the light control particles LCP satisfies the above range, the light control particles LCP may be more easily drawn into the first portion P1 through the spaces.

In an embodiment, a content of the light control particles LCP included in the developer DEV may be about 10 wt % or more based on a total weight of the developer DEV. Specifically, a content of the light control particles LCP included in the developer DEV may be about 10 wt % to about 50 wt %, preferably about 10 wt % to about 30 wt %, based on a total weight of the developer DEV. When a content of the light control particles LCP satisfies the above range, the light control particles LCP may be sufficiently drawn into the first portion P1, and damage to the first portion P1 may be prevented or reduced, and thus durability deterioration of the partition wall structure BNK formed in a subsequent step may be prevented or reduced.

In an embodiment, the light control particles LCP may include at least one selected from an inorganic material, a metal material, an organic light emitting material, and/or a quantum dot. Examples of the inorganic material that can be used as the light control particles LCP may include titanium oxide (TiO2), aluminum oxide (Al2O3), zirconium oxide (ZrO2), silicon oxide (SiO2), and/or the like. Examples of the metal material that can be used as the light control particles LCP may include gold (Au), silver (Ag), aluminum (Al), and/or the like. All of the above materials may be used alone or in combination with each other.

Figure 9:
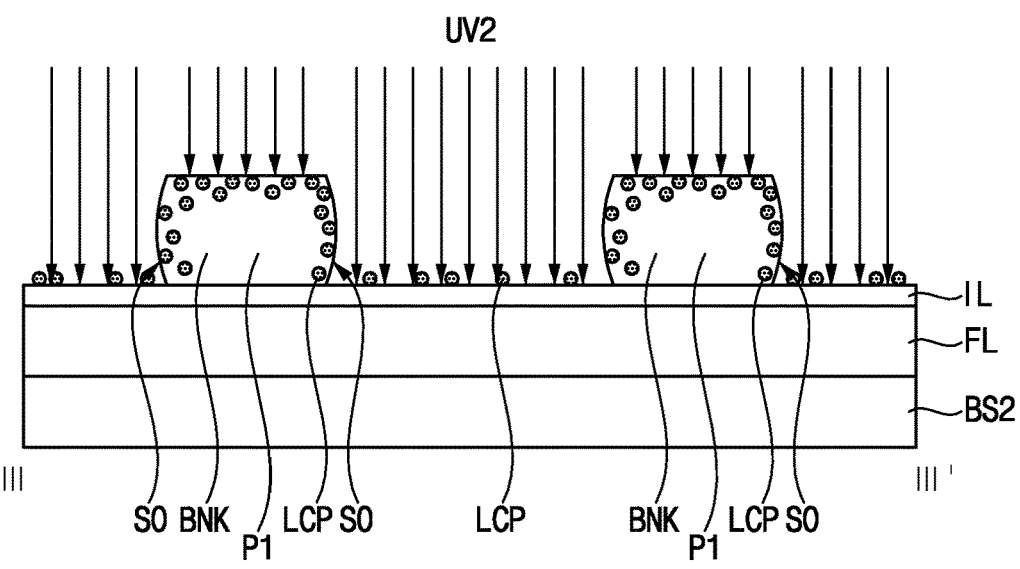
FIG. 9 is a cross-sectional view of an upper structure illustrating a method of manufacturing an upper structure included in the display device of FIG. 3 according to an embodiment.

Further referring to FIG. 9, in an embodiment, structures on the second base substrate BS2 may be exposed to UV2 entirely. For example, the inorganic insulating layer IL and the first portion P1 which remains may be exposed to UV2. Accordingly, the first portion P1 may be cured. Thus, the partition wall structure BNK having the accommodation openings SO may be formed.

In an embodiment, as the first portion P1 is cured, the light control particles LCP drawn into the first portion P1 may be encapsulated in the first portion P1. For example, when the first portion P1 shrinks due to curing, the light control particles LCP drawn into the first portion P1 may be encapsulated in the first portion P1. Accordingly, the light control particles LCP may be included in the partition wall structure BNK. Meanwhile, in order to cure the first portion P1, a separate heating process may be performed in addition to the exposure to UV2 process.

In an embodiment, the light control particles LCP may be more intensively dispersed at the outer portion of the partition wall structure BNK than at the center portion. That is, a density of the light control particles LCP at the outer portion of the partition wall structure BNK may be greater than a density of the light control particles LCP at the center portion of the partition wall structure BNK.

In an embodiment, the light control particles LCP may control a path of light incident to the partition wall structure BNK. Accordingly, light efficiency of the display device 1000 may be increased and/or display quality of the display device 1000 may be improved.

In an embodiment, a content of the light control particles LCP included in the partition wall structure BNK may be about 7 wt % or more based on a total weight of the partition wall structure BNK. Specifically, a content of the light control particles LCP included in the partition wall structure BNK may be about 7 wt % to about 20 wt %, preferably about 7 wt % to about 15 wt %, based on a total weight of the partition wall structure BNK. When a content of the light control particles LCP satisfies the above range, a path of light incident to the partition wall structure BNK may be more easily controlled.

Figure 10:
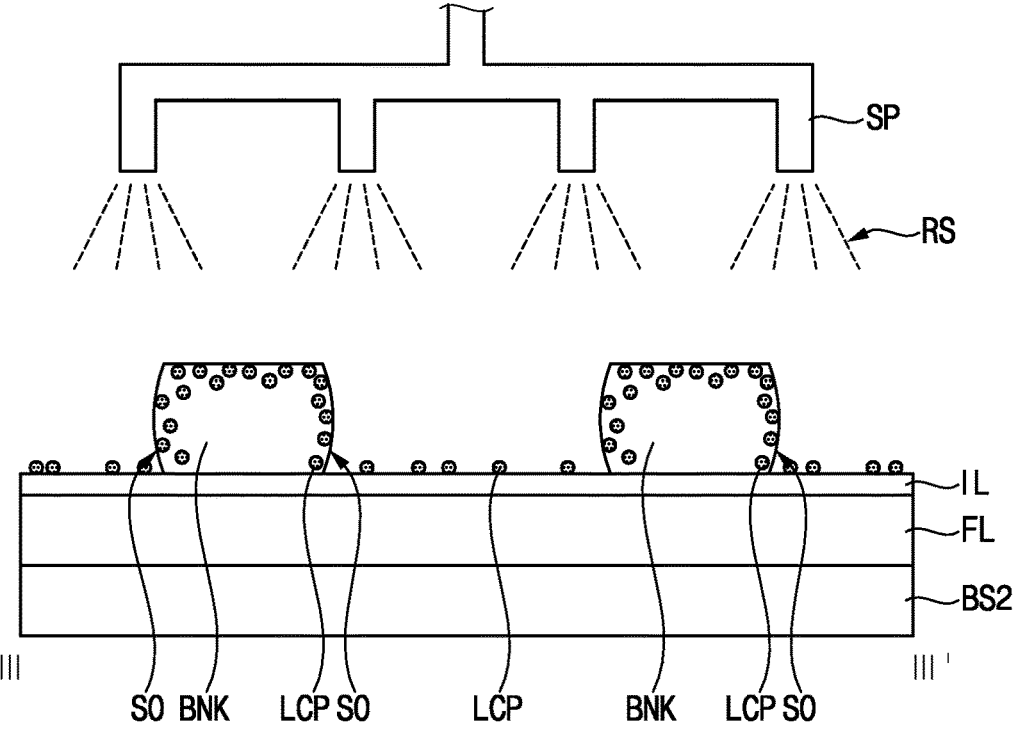
FIG. 10 is a cross-sectional view of an upper structure illustrating a method of manufacturing an upper structure included in the display device of FIG. 3 according to an embodiment.
Figure 11:
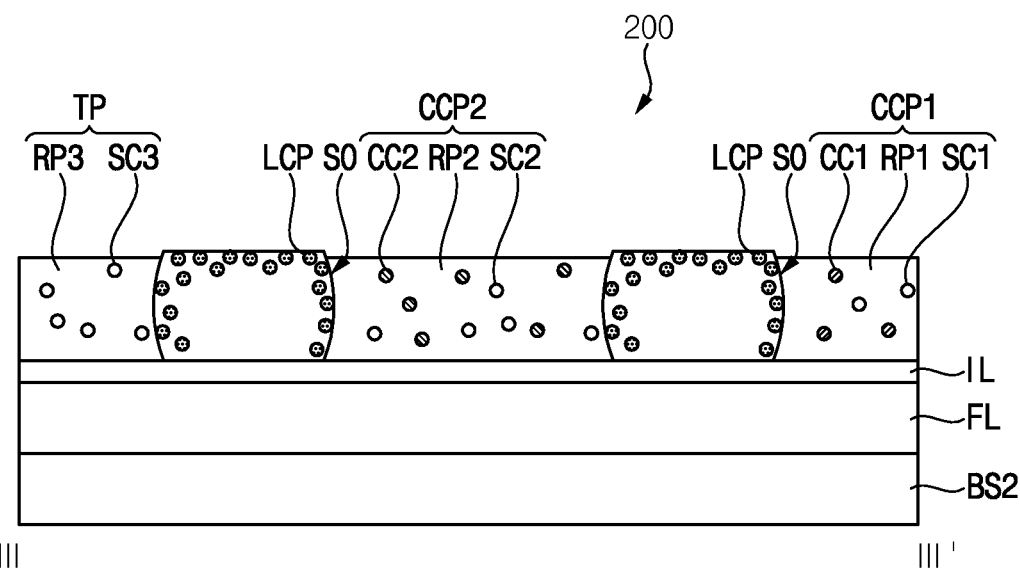
FIG. 11 is a cross-sectional view of an upper structure illustrating a method of manufacturing an upper structure included in the display device of FIG. 3 according to an embodiment.

Further referring to FIGS. 10 and 11, in an embodiment, the light control particles LCP in the accommodation openings SO may be removed using a rinsing liquid RS. For example, the rinsing liquid RS may be supplied to a surface of the inorganic insulating layer IL through a spray SP. In an embodiment, the rinsing liquid RS may include distilled water, ethanol, potassium hydroxide (KOH), propylene glycol methyl ether acetate (PGMEA), octadecyltrichlorosilane, and/or the like. Meanwhile, the light control particles LCP included in the partition wall structure BNK may not be affected by the rinsing liquid RS due to their binding force with a material constituting the partition wall structure BNK. Accordingly, only the light control particles LCP in the accommodation openings SO may be selectively removed by the rinsing liquid RS.

In an embodiment and as shown in FIG. 11, the color conversion layer CCL may be formed in the accommodation openings SO. The color conversion layer CCL may include the first color conversion part CCP1, the second color conversion part CCP2, and the transmission part TP respectively disposed in the accommodation openings SO. The first color conversion part CCP1 may include the resin part RP1, the scatters SC1, and the color conversion particles CC1, the second color conversion part CCP2 may include the resin part RP2, the scatters SC2, and the color conversion particles CC2, and the transmission part TP may include the resin part RP3 and the scatters SC3.

According to embodiments, as the preliminary partition wall layer BNK-A is developed using a developer DEV containing the light control particles LCP after exposing the preliminary partition wall layer BNK-A, the partition wall structure BNK including light control particles LCP may be formed. Accordingly, even if the preliminary partition wall layer BNK-A does not include the light control particles LCP, the partition wall structure BNK including the light control particles LCP may be formed.

Accordingly, in an embodiment, when the mask MSK disposed on the preliminary partition wall layer BNK-A is aligned, a degree of recognition of the first alignment mark AL1 disposed under the preliminary partition wall layer BNK-A may be improved. In other words, in the process of aligning the mask MSK, since the preliminary partition wall layer BNK-A does not include the light control particles LCP, interference of a signal path for recognizing the first alignment mark AL1 can be reduced or prevented. Accordingly, a degree of recognition of the first alignment mark AL1 may be improved. Accordingly, accuracy and efficiency of the manufacturing process of the display device 1000 may be improved.

In addition, in an embodiment, since the preliminary partition wall layer BNK-A does not include the light control particles LCP in the exposure UV1 process using the mask MSK, interference of a path of light traveling into the preliminary partition wall layer BNK-A can be reduced or prevented. For example, light traveling into the preliminary partition wall layer BNK-A may not be reflected or scattered. Accordingly, non-uniformity of an exposed portion of the preliminary partition wall layer BNK-A may be reduced or prevented. Accordingly, it may be possible to prevent an undercut from occurring in the partition wall structure BNK formed by a subsequent process. In addition, generation of residual film due to reflected or scattered light can be reduced or prevented. Accordingly, reliability of the display device 1000 may be improved and display quality of the display device 1000 may be improved.

Figure 12:
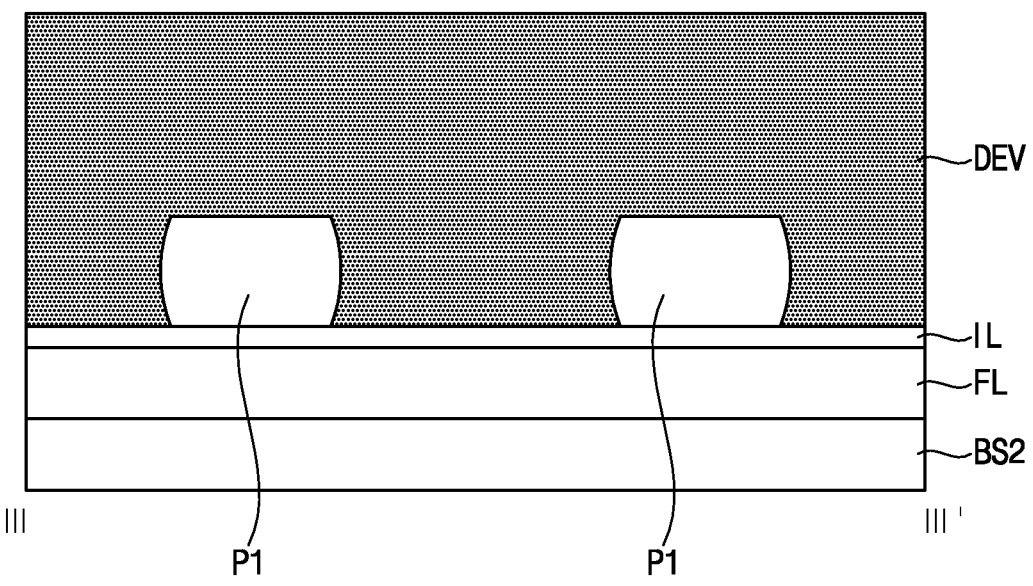
FIG. 12 is a cross-sectional view of an upper structure illustrating a method of manufacturing an upper structure included in the display device of FIG. 3 according to another embodiment.
Figure 13:
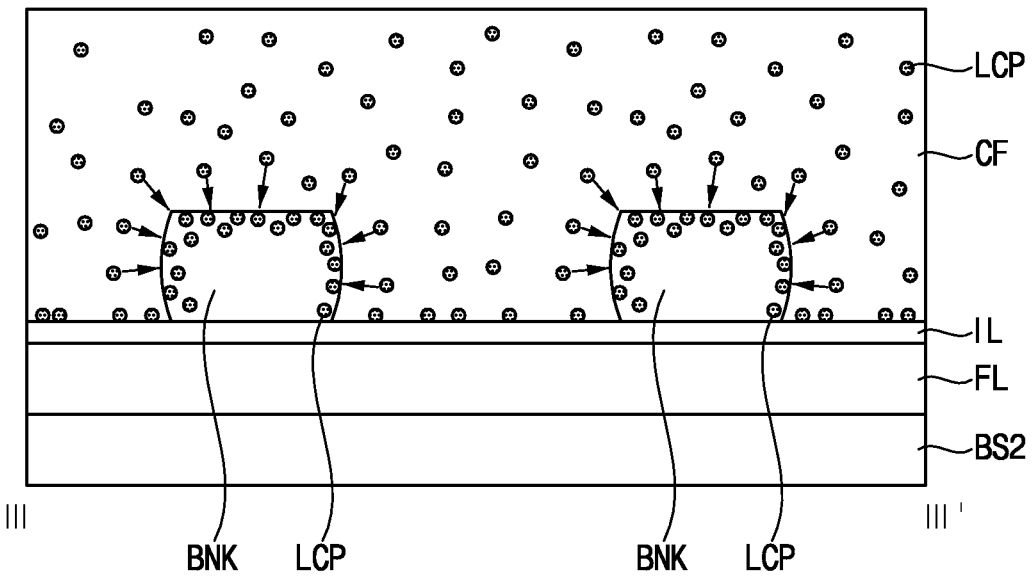
FIG. 13 is a cross-sectional view of an upper structure illustrating a method of manufacturing an upper structure included in the display device of FIG. 3 according to another embodiment.

FIGS. 12 and 13 are cross-sectional views of an upper structure illustrating a method of manufacturing an upper structure included in the display device of FIG. 3 according to another embodiment.

Hereinafter, a method of manufacturing the upper structure 200 included in the display device 1000 according to another embodiment will be described with reference to FIGS. 4 to 7 and 9 to 13.

In an embodiment and as shown in FIGS. 4 to 7, the functional layer FL, the inorganic insulating layer IL, and the preliminary partition wall layer BNK-A may be formed on the dummy substrate DS and the second base substrate BS2, thereafter, the mask MSK may be disposed on the preliminary partition wall layer BNK-A, and the preliminary partition wall layer BNK-A exposed by the opening OP of the mask MSK may be exposed to UV1. Since the above process is the same as the process described with reference to FIGS. 4 to 7, a detailed description will be omitted.

In an embodiment and as shown in FIG. 12, the preliminary partition wall layer BNK-A may be developed with the developer DEV to leave the first portion P1 which is exposed to UV1 and to remove the second portion P2. However, the developer DEV may not include the light control particles LCP described with reference to FIG. 8.

In an embodiment, in a process of developing the preliminary partition wall layer BNK-A with the developer DEV, the first portion P1 which remains may absorb the developer DEV and swell. Accordingly, spaces (e.g., pores) through which external materials may be drawn may be formed on an outer portion (e.g., surface) of the first portion P1.

As shown in FIG. 13, in an embodiment, a carrier fluid CF including the light control particles LCP may be provided to the first portion P1 which remains. For example, the light control particles LCP may be dispersed in the carrier fluid CF. In an embodiment, unlike the developer DEV, the carrier fluid CF may be a material that does not change a pattern of the first portion P1. Examples of materials that can be used as the carrier fluid CF may include water, ethanol, and/or the like, but the invention is not limited thereto.

Accordingly, in an embodiment, the light control particles LCP included in the carrier fluid CF may be drawn into the first portion P1. For example, the light control particles LCP may be drawn into the first portion P1 through the spaces formed as the first portion P1 swells.

In an embodiment, the light control particles LCP may be concentrated in the outer portion of the first portion P1. In other words, a density of the light control particles LCP at the outer portion of the first portion P1 may be greater than a density of the light control particles LCP at the center portion of the first portion P1.

As shown in FIGS. 9 to 11, in an embodiment, the partition wall structure BNK may be formed by curing the first portion P1 by exposing the structures on the second base substrate BS2 entirely, and then the light control particles LCP in the accommodation openings SO may be removed using the rinsing liquid RS, and the color conversion layer CCL may be formed in the accommodation openings SO. Since the above process is substantially the same as the process described with reference to FIGS. 9 to 11, a detailed description will be omitted.

According to an embodiment, even when the preliminary partition wall layer BNK-A is developed with the developer DEV not containing the light control particles LCP, the partition wall structure BNK including the light control particles LCP may be formed by providing the carrier fluid CF containing the light control particles LCP.

Accordingly, in an embodiment, the preliminary partition wall layer BNK-A may not include the light control particles LCP in a process of aligning the mask MSK and a process of exposing UV1. Accordingly, a degree of recognition of the first alignment mark AL1 disposed below the preliminary partition wall layer BNK-A may be improved, a reliability of the partition wall structure BNK may be improved, and a display quality of the display device 1000 may be improved.

Figure 14:
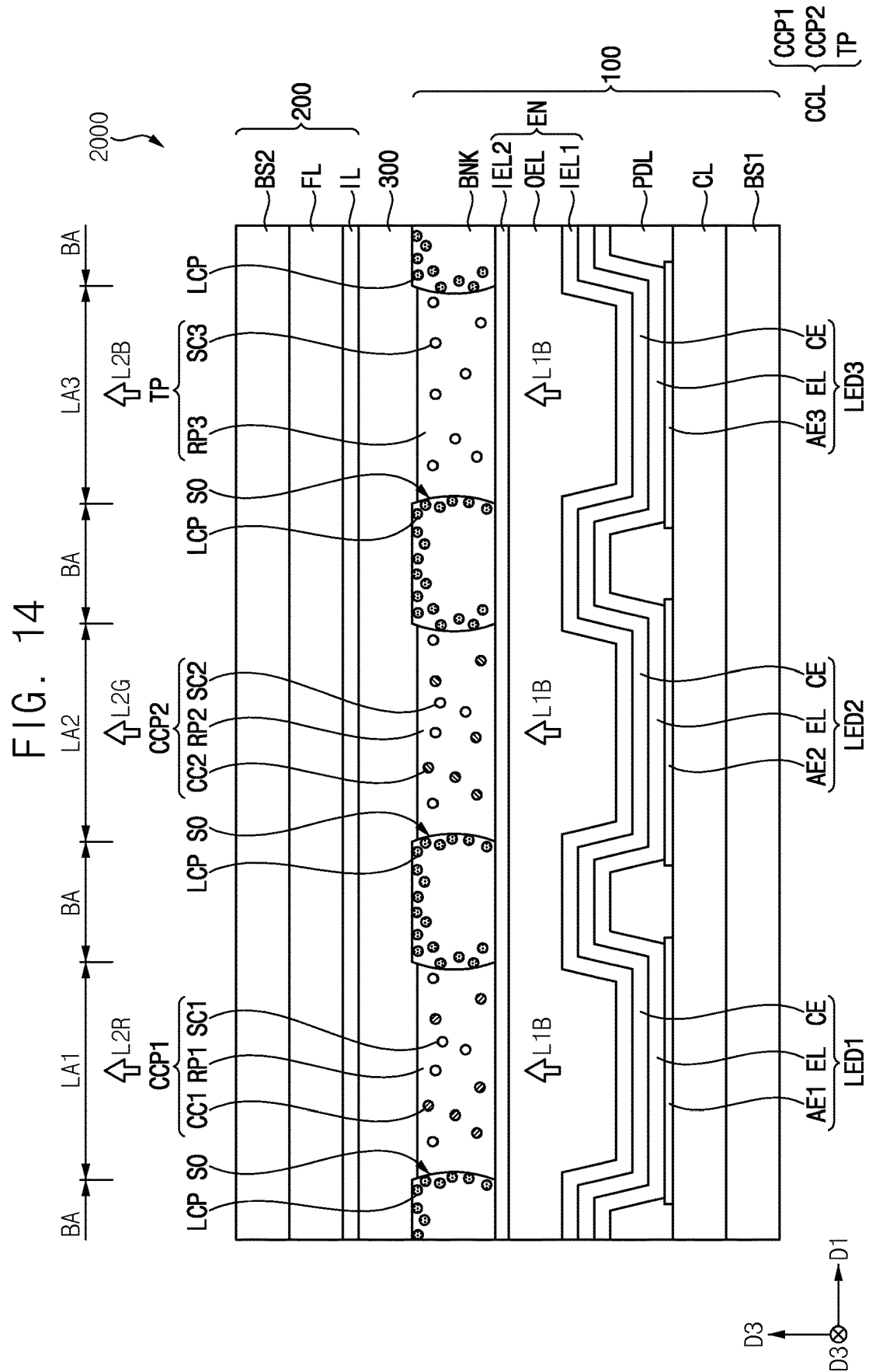
FIG. 14 is a cross-sectional view illustrating a display device according to another embodiment.

FIG. 14 is a cross-sectional view illustrating a display device according to another embodiment. For example, FIG. 14 may be an enlarged cross-sectional view of area 'A' of FIG. 2 according to another embodiment. That is, FIG. 14 may correspond to the cross-sectional view of FIG. 3.

Referring to FIG. 14, the display device 2000 according to another embodiment may be substantially the same as the display device 1000 described with reference to FIGS. 1 to 3, except for positions where the partition wall structure BNK and the color conversion layer CCL are disposed. Therefore, redundant descriptions will be omitted.

As shown in FIG. 14, an embodiment of the display device 2000 may include the lower structure 100 and the upper structure 200, and the lower structure 100 may include the partition wall structure BNK and the color conversion layer CCL. That is, the partition wall structure BNK and the color conversion layer CCL may be included in the lower structure 100. In other words, the partition wall structure BNK and the color conversion layer CCL may be included in the lower structure 100 instead of the upper structure 200. For example, in a manufacturing process of the display device 2000, after the partition wall structure BNK and the color conversion layer CCL are formed on the first base substrate BS1, the lower structure 100 may be bonded on the partition wall structure BNK and the color conversion layer CCL.

In an embodiment, the partition wall structure BNK and the color conversion layer CCL may be directly disposed on the encapsulation layer EN. However, the invention is not limited thereto. For example, in another embodiment, the lower structure 100 may further include a touch sensing layer disposed on the encapsulation layer EN, and the partition wall structure BNK may be directly disposed on the touch sensing layer.

In an embodiment, the partition wall structure BNK and the color conversion layer CCL may be covered by the filling layer 300. That is, the partition wall structure BNK may be disposed between the encapsulation layer EN and the filling layer 300. However, the invention is not limited thereto, and the filling layer 300 may be omitted.

In an embodiment, as the partition wall structure BNK and the color conversion layer CCL are included in the lower structure 100, a distance between the color conversion layer CCL and the light emitting devices LED1, LED2, and LED3 may be shortened. Accordingly, light efficiency of the display device 2000 may be further improved and the display quality of the display device 2000 may be further improved.

In an embodiment, a manufacturing method of the lower structure 100 shown in FIG. 14 may be substantially the same as or similar to a manufacturing method of the upper structure 200 described with reference to FIGS. 4 to 13, except that the partition wall structure BNK and the color conversion layer CCL are formed on a laminated structure formed on the first base substrate BS1. Therefore, redundant descriptions will be omitted.

According to embodiments, the display device 2000 may include the partition wall structure BNK and the color conversion layer CCL. The color conversion layer CCL may be disposed within the accommodation openings SO defined by the partition wall structure BNK and may convert a color of incident light. The partition wall structure BNK may include the light control particles LCP which control a path of incident light. For example, the light control particles LCP may scatter and/or reflect light incident on the partition wall structure BNK. In addition, a density of the light control particles LCP at the outer portion of the partition wall structure BNK may be greater than a density of the light control particles LCP at the center portion of the partition wall structure BNK. Accordingly, a path of light incident to the partition wall structure BNK among lights emitted from the light emitting device can be easily adjusted. Accordingly, light efficiency of the display device 2000 may be increased and the display quality of the display device 2000 may be improved.

In addition, according to the manufacturing method of the display device 2000 according to embodiments, the preliminary partition wall layer BNK-A may be exposed and developed to form the partition wall structure BNK, and even if the preliminary partition wall layer BNK-A does not include the light control particles LCP, the partition wall structure BNK including the light control particles LCP may be formed.

Accordingly, in an embodiment, in the process of aligning the mask MSK, since the preliminary partition wall layer BNK-A does not include the light control particles LCP, interference of a signal path for recognizing the first alignment mark AL1 can be reduced or prevented. Accordingly, a degree of recognition of the first alignment mark AL1 may be improved. Accordingly, accuracy and efficiency of the manufacturing process of the display device 2000 may be improved.

In addition, in an embodiment, since the preliminary partition wall layer BNK-A does not include the light control particles LCP in the UV1 exposure process using the mask MSK, interference of a path of light traveling into the preliminary partition wall layer BNK-A can be reduced or prevented. For example, light traveling into the preliminary partition wall layer BNK-A may not be reflected or scattered. Accordingly, non-uniformity of an exposed portion of the preliminary partition wall layer BNK-A may be reduced or prevented. Accordingly, it may be possible to prevent an undercut from occurring in the partition wall structure BNK formed by a subsequent process. In addition, generation of residual film due to reflected or scattered light can be reduced or prevented. Accordingly, reliability of the partition wall structure BNK may be improved and display quality of the display device 2000 may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims. Moreover, the embodiments or parts of the embodiments may be combined in whole or in part without departing from the scope of the invention.

What is claimed is:

1. A display device comprising:
a base substrate;
a partition wall structure disposed on the base substrate, wherein the partition wall structure includes an accommodation opening and light control particles; and
a color conversion layer disposed within the accommodation opening, and including color conversion particles,
wherein a density of the light control particles disposed at an outer portion of the partition wall structure is greater than a density of the light control particles disposed at a center portion of the partition wall structure.

2. The display device of claim 1, wherein the light control particles scatter or reflect light incident thereon.

3. The display device of claim 1, wherein the light control particles have an average size in a range of about 50 nm to about 300 nm.

4. The display device of claim 1, wherein a percentage by weight wt % of the light control particles included in the partition wall structure is equal to or larger than about 7 wt % of a total weight of the partition wall structure.

5. A method of manufacturing a display device, the method comprising:
forming a preliminary partition wall layer on a base substrate to cover the base substrate;
disposing a mask having an opening on the preliminary partition wall layer;
exposing the preliminary partition wall layer exposed by the opening;
developing the preliminary partition wall layer with a developer containing light control particles to leave a first portion of the preliminary partition wall layer and to remove a second portion of the preliminary partition wall layer;
curing the first portion of the preliminary partition wall layer to form a partition wall structure having an accommodation opening; and
forming a color conversion layer having color conversion particles in the accommodation opening.

6. The method of claim 5, wherein in the developing the preliminary partition wall layer,
the first portion absorbs the developer, and
the light control particles are drawn into the first portion.

7. The method of claim 6, wherein the light control particles are drawn into the first portion to be encapsulated within the first portion.

8. The method of claim 7, wherein the light control particles are included in the partition wall structure.

9. The method of claim 8, wherein a density of the light control particles at an outer portion of the partition wall structure is greater than a density of the light control particles at a center portion of the partition wall structure.

10. The method of claim 5, wherein a percentage by weight wt % of the light control particles included in the developer is equal to or larger than about 10 wt % of a total weight of the developer.

11. The method of claim 5, further comprising:
removing the light control particles in the accommodation opening using a rinsing liquid after the curing the first portion of the preliminary partition wall layer to form the partition wall structure and before the forming the color conversion layer.

12. The method of claim 5, wherein
the preliminary partition wall layer covers a dummy substrate located adjacent to the base substrate and having a first alignment mark disposed thereon.

13. The method of claim 12, wherein the mask includes a second alignment mark, and
wherein disposing the mask includes disposing the mask based on a position of the first alignment mark and a position of the second alignment mark.

14. The method of claim 5, wherein the light control particles scatter or reflect light incident thereon.

15. The method of claim 5, wherein the light control particles have an average size in a range of about 50 nm to about 300 nm.

16. A method of manufacturing a display device, the method comprising:
forming a preliminary partition wall layer on a base substrate to cover the base substrate;
disposing a mask having an opening on the preliminary partition wall layer;
exposing the preliminary partition wall layer exposed by the opening;
developing the preliminary partition wall layer with a developer to leave a first portion of the preliminary partition wall layer and to remove a second portion of the preliminary partition wall layer;
providing a carrier fluid containing light control particles to the first portion of the preliminary partition wall layer;
curing the first portion of the preliminary partition wall layer to form a partition wall structure having an accommodation opening; and
forming a color conversion layer including color conversion particles in the accommodation opening.

17. The method of claim 16, wherein in the developing the preliminary partition wall layer, the first portion absorbs the developer, and
wherein in the providing the carrier fluid, the light control particles are drawn into the first portion.

18. The method of claim 17, wherein the light control particles are drawn into the first portion to be encapsulated within the first portion.

19. The method of claim 18, wherein the light control particles are included in the partition wall structure.

20. The method of claim 19, wherein a density of the light control particles at an outer portion of the partition wall structure is greater than a density of the light control particles at a center portion of the partition wall structure.

* * * * *